(12) United States Patent
Kuo et al.

(10) Patent No.: US 9,679,848 B2
(45) Date of Patent: Jun. 13, 2017

(54) INTERCONNECT STRUCTURE FOR SEMICONDUCTOR DEVICES

(71) Applicant: Taiwan Semiconductor Manufacturing Company, Ltd., Hsin-Chu (TW)

(72) Inventors: Han-Hsin Kuo, Tainan (TW); Chung-Chi Ko, Nantou (TW); Neng-Jye Yang, Hsin-Chu (TW); Fu-Ming Huang, Shengang Township (TW); Chi-Ming Tsai, New Taipei (TW); Liang-Guang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/282,704

(22) Filed: Sep. 30, 2016

(65) Prior Publication Data

US 2017/0018496 A1   Jan. 19, 2017

Related U.S. Application Data

(62) Division of application No. 14/145,397, filed on Dec. 31, 2013, now Pat. No. 9,460,997.

(51) Int. Cl.
*H01L 27/108* (2006.01)
*H01L 23/528* (2006.01)
(Continued)

(52) U.S. Cl.
CPC ...... *H01L 23/528* (2013.01); *H01L 21/02337* (2013.01); *H01L 21/02343* (2013.01);
(Continued)

(58) Field of Classification Search
CPC .......... H01L 21/7684; H01L 21/76877; H01L 21/76829; H01L 21/02337;
(Continued)

(56) References Cited

U.S. PATENT DOCUMENTS 4,330,569 A   5/1982   Gulett et al.
5,429,673 A   7/1995   Peterson et al.
(Continued)

FOREIGN PATENT DOCUMENTS

CN   101010794 A   8/2007
CN   102148190 A   8/2011

OTHER PUBLICATIONS

Fruehauf, S., et al., "Hydrophobisation Process for Porous Low K Dielectric Silica Layers," Advanced Metallization Conference, 2002, 8 pages.

*Primary Examiner* — Yosef Gebreyesus
(74) *Attorney, Agent, or Firm* — Slater Matsil, LLP

(57) ABSTRACT

An interconnect and a method of forming an interconnect for a semiconductor device is provided. The interconnect is formed by treating an upper surface of a dielectric layer to create a high density layer. The treatment may include, for example, creating a high density monolayer using hexamethyldisilazane (HMDS), trimethylsilydiethylamine (TMS-DEA) or trimethylsilylacetate (OTMSA). After treating, the dielectric layer may be patterned to create openings, which are subsequently filled with a conductive material. Excess conductive material may be removed using, for example, a chemical mechanical polishing.

20 Claims, 3 Drawing Sheets

(51) Int. Cl.
*H01L 21/3105* (2006.01)
*H01L 21/321* (2006.01)
*H01L 21/768* (2006.01)
*H01L 23/522* (2006.01)
*H01L 21/02* (2006.01)
*H01L 21/311* (2006.01)
*H01L 23/532* (2006.01)

(52) U.S. Cl.
CPC .... *H01L 21/02359* (2013.01); *H01L 21/3105* (2013.01); *H01L 21/31055* (2013.01); *H01L 21/31144* (2013.01); *H01L 21/3212* (2013.01); *H01L 21/7684* (2013.01); *H01L 21/76802* (2013.01); *H01L 21/76822* (2013.01); *H01L 21/76826* (2013.01); *H01L 21/76829* (2013.01); *H01L 21/76877* (2013.01); *H01L 23/5226* (2013.01); *H01L 23/5329* (2013.01); *H01L 23/53228* (2013.01); *H01L 23/53295* (2013.01); *H01L 21/76807* (2013.01); *H01L 23/53223* (2013.01); *H01L 23/53238* (2013.01); *H01L 23/53252* (2013.01); *H01L 23/53266* (2013.01); *H01L 2924/0002* (2013.01)

(58) Field of Classification Search
CPC ......... H01L 21/02343; H01L 21/02359; H01L 21/3105; H01L 21/31055; H01L 21/31144; H01L 21/3212; H01L 21/76802; H01L 23/528; H01L 23/5226; H01L 23/53228; H01L 23/5329; H01L 23/53295; H01L 23/53223; H01L 23/53226

See application file for complete search history.

(56) References Cited

U.S. PATENT DOCUMENTS

| | | |
|---|---|---|
| 5,569,628 A | 10/1996 | Yano et al. |
| 5,702,767 A | 12/1997 | Peterson et al. |
| 6,348,407 B1 | 2/2002 | Gupta et al. |
| 6,939,800 B1 | 9/2005 | Lu et al. |
| 7,244,631 B1 | 7/2007 | De Groot et al. |
| 8,242,028 B1 | 8/2012 | van Schravendijk et al. |
| 8,288,295 B2 | 10/2012 | Oku et al. |
| 2001/0049195 A1 | 12/2001 | Chooi et al. |
| 2003/0001276 A1* | 1/2003 | Enomoto .......... H01L 21/32051 257/764 |
| 2003/0049460 A1 | 3/2003 | O'Neill et al. |
| 2003/0198895 A1 | 10/2003 | Toma et al. |
| 2004/0018748 A1 | 1/2004 | Lu et al. |
| 2004/0053498 A1 | 3/2004 | Kaji et al. |
| 2004/0104439 A1 | 6/2004 | Kaukka et al. |
| 2004/0152296 A1 | 8/2004 | Matz et al. |
| 2005/0200025 A1 | 9/2005 | Casey et al. |
| 2005/0233586 A1 | 10/2005 | Matz et al. |
| 2006/0091401 A1 | 5/2006 | Yoshizawa et al. |
| 2006/0202311 A1 | 9/2006 | Nguyen et al. |
| 2007/0077782 A1 | 4/2007 | Lee et al. |
| 2007/0190777 A1 | 8/2007 | Jiang et al. |
| 2007/0231484 A1 | 10/2007 | Hishiya et al. |
| 2009/0250815 A1 | 10/2009 | Yang et al. |
| 2009/0311874 A1 | 12/2009 | Tomita et al. |
| 2011/0017705 A1 | 1/2011 | Jalabert |
| 2012/0287709 A1* | 11/2012 | Suguro .............. G11C 13/0002 365/171 |
| 2013/0052366 A1* | 2/2013 | Chen .................. C23C 18/1608 427/535 |
| 2013/0189837 A1 | 7/2013 | Haukka et al. |
| 2014/0134824 A1 | 5/2014 | Chen et al. |
| 2014/0162425 A1* | 6/2014 | Chi .................. H01L 21/02148 438/303 |
| 2014/0213037 A1 | 7/2014 | LiCausi et al. |

* cited by examiner

INTERCONNECT STRUCTURE FOR SEMICONDUCTOR DEVICES

This application is a divisional application and claims the benefit of U.S. patent application Ser. No. 14/145,397, filed Dec. 31, 2013, entitled "Interconnect Structure For Semiconductor Devices," which application is incorporated herein by reference in its entirety.

BACKGROUND

In integrated circuit art, a commonly used method for forming interconnect structures, which include metal lines and vias, is known as "damascene." Generally, this method involves forming an opening in a dielectric layer, which separates the vertically spaced metallization layers. The opening is typically formed using lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is commonly used in damascene structures because of its low resistivity. Typically, an interconnect structure is formed of a plurality of metallization layers, each including a plurality of copper lines. Copper lines in different metallization layers are interconnected by vias. While copper is generally preferred due to its electrical characteristics, other materials may be used.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming metal features in metallization layers of integrated circuits are provided. The intermediate stages of manufacturing embodiments of the present invention are illustrated. Throughout various views and illustrative embodiments of the present invention, like reference numbers are used to designate like elements.

Figure 1:
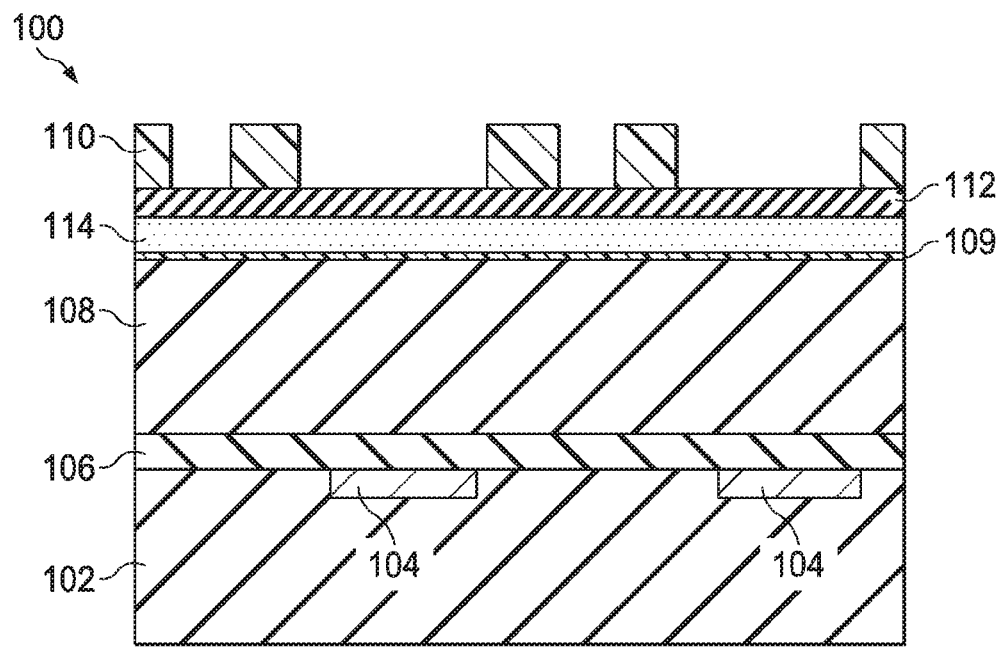
FIGS. 1-4 illustrate various intermediate stages in a manufacture of a semiconductor device in accordance with an embodiment.

FIGS. 1-4 illustrate various intermediate stages of a method of forming a semiconductor device in accordance with an embodiment. Referring first to FIG. 1, wafer 100 having a first dielectric layer 102 formed thereon is shown. The wafer 100 may include a substrate (not explicitly shown) underlying the first dielectric layer 102, and may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

In an embodiment, electrical circuitry is formed on the substrate and may be any type of circuitry suitable for a particular application. In an embodiment, the electrical circuitry includes electrical devices formed on the substrate with one or more dielectric layers overlying the electrical devices. Metal layers may be formed between overlying dielectric layers, such as those discussed herein, to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first dielectric layer 102 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). Other materials, such as ultra low-k materials (e.g., having a dielectric constant less than about 2.9), such as k=2.5-2.6, may also be used. These materials and processes are provided as examples and other materials and processes may be used.

Also shown in FIG. 1 are conductive elements 104 formed in the first dielectric layer 102. The conductive elements 104 may be formed by, for example, creating openings in the first dielectric layer 102 using photolithography techniques. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the openings in which the conductive elements 104 are to be formed in the first dielectric layer 102. The etching process may be a wet or dry, anisotropic or isotropic, etch process, such as an anisotropic dry etch process. After the opening is formed in the first dielectric layer 102, a conductive material may be deposited to fill the openings. The conductive elements 104 may comprise metals, elemental metals, transition metals, or the like, such as a copper interconnect. Furthermore, the conductive elements 104 may include one or more barrier/adhesion layers.

Optionally, over the first dielectric layer 102 and the conductive elements 104 is an etch stop layer (ESL) 106 in accordance with an embodiment. Generally, the etch stop layers provide a mechanism to stop an etching process when forming vias and/or contacts. The etch stop layers are formed of a dielectric material having a different etch selectivity from adjacent layers, e.g., the underlying first dielectric layer 102 or substrate. In an embodiment, etch stop layers may be formed of SiN, SiCN, SiCO, CN, combinations thereof, or the like, deposited by CVD or PECVD techniques.

Over the ESL 106 is a second dielectric layer 108 in accordance with an embodiment. As discussed in greater detail below, the second dielectric layer 108 is the layer that is to be subsequently patterned to, for example, form conductive lines and/or vias. For example, the second dielectric layer 108 may be patterned to form vias extending to the conductive elements 104 and to form conductive lines to interconnect various electrical elements.

The second dielectric layer 108 may be formed of similar materials using similar processes as those used to form the first dielectric layer 102; however, different materials and processes may be used. Additionally, the first dielectric layer 102 may be formed of the same or different material as that used to form the second dielectric layer 108.

It should be noted that the first dielectric layer 102 and the conductive elements 104 are shown for illustrative purposes. In other embodiments, the first dielectric layer 102 may be replaced with a semiconductor substrate, with or without the ESL 106. For example, in another embodiment, the second dielectric layer 108 (the layer to be patterned) is an inter-layer dielectric layer formed over a substrate having electrical devices formed thereon. In this embodiment, the optional ESL 106 may be, for example, a silicon nitride contact etch stop layer/stress layer formed over transistors formed on the substrate. The second dielectric layer 108 is subsequently patterned to form contacts to the electrical devices, such as a source or drain contact to a transistor.

In an embodiment, a process is performed on the exposed surface of the second dielectric layer 108 to create a hydrophobic surface, or reduce the hydrophlicity of the surface. FIG. 1 illustrates an embodiment in which a high density monolayer 109 is formed over the second dielectric layer 108. The high density monolayer 109 may be formed using, for example, hexamethyldisilazane (HMDS), trimethylsilydiethylamine (TMSDEA) or trimethylsilylacetate (OTMSA). The high density monolayer 109 exhibits a higher density than a density of the underlying second dielectric layer 108. Generally, low-k dielectric materials have a density of about 0.9 g/cm³ to about 1.4 g/cm³. For example, if the second dielectric layer 108 is formed of a material having a density of about 1.0 g/cm³, then the high density monolayer 109 has a density greater than 1.0 g/cm³.

In an embodiment, the second dielectric layer 108 may be treated with HMDS by placing the wafer in a process chamber and exposing the second dielectric layer 108 to an HMDS vapor at a temperature of 90° C. or greater (e.g., from about 90° C. to about 180° C.) and process about from about 20 minutes to about 40 minutes, such as about 30 minutes. The HMDS vapor may be pure HMDS or HMDS diluted with toluene, benzene, or the like to obtain about 5% to about 10% concentration of HMDS at a partial pressure of about 10 mm Hg to about 30 mm Hg. The process chamber may further have a low concentration of $O_2$, such as a partial pressure of about 1 mtorr. After immersing in the TMSDEA solution, a cleaning procedure, such as deionized water rinse, isopropyl alcohol (IPA) rinse, an acetone rinse, and/or the like, may also be performed to remove non-reacted portions.

In another embodiment, the second dielectric layer 108 is treated with TMSDEA by immersing the wafer in a bath of a diluted TMSDEA solution at a temperature of 90° C. or greater (e.g., from about 90° C. to about 180 ° C.) and process about from about 20 minutes to about 40 minutes, such as about 30 minutes. The process chamber may further have a low concentration of $O_2$, such as a partial pressure of about 1 mtorr. After immersing in the TMSDEA solution, a cleaning procedure, such as deionized water rinse, isopropyl alcohol (IPA) rinse, an acetone rinse, and/or the like, may also be performed to remove non-reacted portions.

In yet another embodiment in which the second dielectric layer is treated with OTMSA by immersing the wafer in a bath of a diluted OTMSA solution at a temperature of 90° C. or (e.g., from about 90° C. to about 180° C.) and process about from about 20 minutes to about 40 minutes, such as about 30 minutes. The process chamber may further have a low concentration of $O_2$, such as a partial pressure of about 1 mtorr. After immersing in the OTMSA solution, a cleaning procedure, such as deionized water rinse, isopropyl alcohol (IPA) rinse, an acetone rinse, and/or the like, may also be performed to remove non-reacted portions.

In embodiments such as these, the terminating OH groups are replaced with $Si(CH_3)_3$ groups, thereby creating a high density monolayer. A subsequent CMP process will frequently result in Cu2+/Cu+ residue on the surface of the underlying layer, causing time dependent dielectric breakdown (TDDB) and breakdown voltage (VBD) issues. This is particularly a problem at the smaller technology nodes, such as those at 20 nm and lower where the distances between interconnects, e.g., the interconnect pitch size, shrinks.

FIG. 1 further illustrates a patterned mask 110 to be used in a subsequent etching process. In an embodiment, the patterned mask 110 comprises a photoresist material that has been deposited over the second dielectric layer 108. Once the photoresist material has been deposited, exposed, and developed to expose a surface of the underlying layer as illustrated in FIG. 1.

A hardmask layer 112 may be used to aid in the subsequent etching process. Generally, the hardmask layer 112 is formed of a material exhibiting a low etch rate as compared to the underlying material to be etched. For example, if the second dielectric layer 108 that is to be patterned is formed of a silicon oxide, the hardmask layer 112 may be formed of, for example, a silicon nitride. In this situation, the silicon nitride of the hardmask layer 112 will have a lower etch rate than the silicon oxide of the second dielectric layer 108, thereby allowing the hardmask layer 112 to act as a mask for the etching of the second dielectric layer 108. It should also be noted that the hardmask layer 112 may comprise a plurality of layers. The hardmask layer 112 has a thickness sufficient to provide protection during the etch process based upon the materials and etchants. In an embodiment, the hardmask layer 112 is formed to a thickness of between about 200 Å and about 600 Å.

Optionally, a anti-reflective coating (ARC) layer 114 may be formed over the high density layer 109 to aid in a subsequent photolithographic process to pattern an overlying layer, such as the patterned mask 110. The ARC layer 114 prevents radiation in a subsequent photolithographic process to reflect off layers below and interfere with the exposure process. Such interference can increase the critical dimension of the photolithography process. The ARC layer 114 may comprise SiON, a polymer, the like, or a combination thereof and may be formed by CVD, a spin-on process, the like, or a combination thereof. The ARC layer 114 has a thickness sufficient to provide sufficient antireflective qualities based upon the materials and the wavelength. In an embodiment, the ARC layer 114 is formed to a thickness of between about 200 Å and about 1000 Å.

Figure 2:
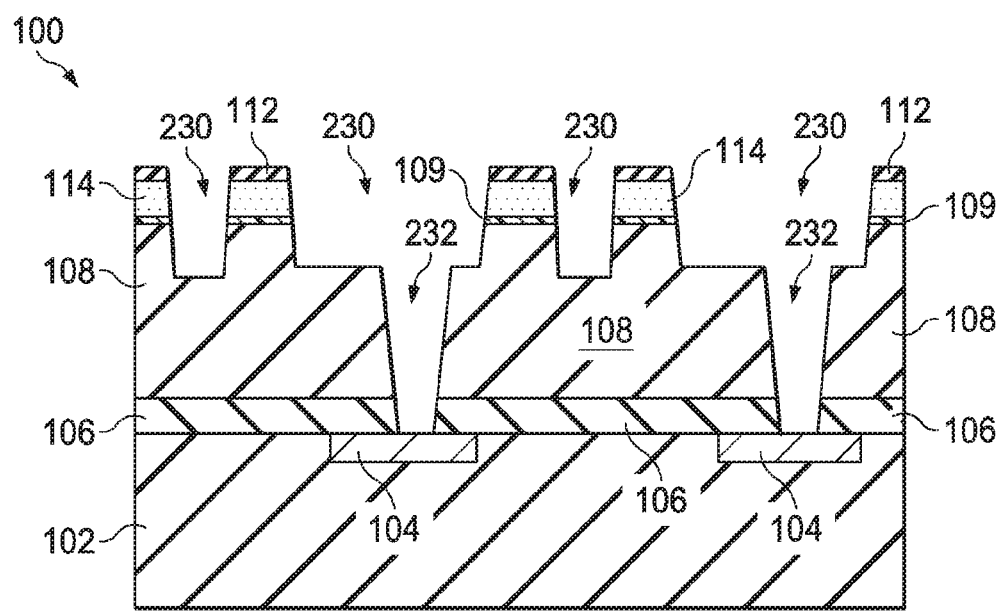

Referring now to FIG. 2, there is shown the wafer 100 after one or more patterning steps to pattern the second dielectric layer 108 in accordance with an embodiment. The pattern of the patterned mask 110 (see FIG. 1) is transferred to the underlying layers. The pattern illustrated herein is provided for illustrative purposes only. The patterning may include formation of lines, vias, lines and vias, or other features, and may include dual damascene patterning techniques such as via-first patterning and/or trench-first patterning. Techniques described herein may also be used with double patterning techniques. Some patterning techniques, such as the dual damascene and double patterning techniques, utilize multiple photoresist layers.

By way of example, FIG. 2 illustrates trench openings 230 and via openings 232 formed in the second dielectric layer 108. In subsequent processing the trench openings 230 and the via openings 232 will be filled with a conductive material. The shallower trench openings 230 will form conductive lines and the via openings 232 will form conductive vias to interconnect metallization layers.

As a result of the etching steps, part of or the entirety of the patterned mask 110 and/or hardmask layer 112 and/or ARC layer 114 (see FIG. 1) may be consumed. FIG. 2 illustrates an embodiment in which a portion of the hardmask layer 112 remains. Optionally, remaining portions of the patterned mask 110 and/or the hardmask layer 112 may be removed.

Figure 3:
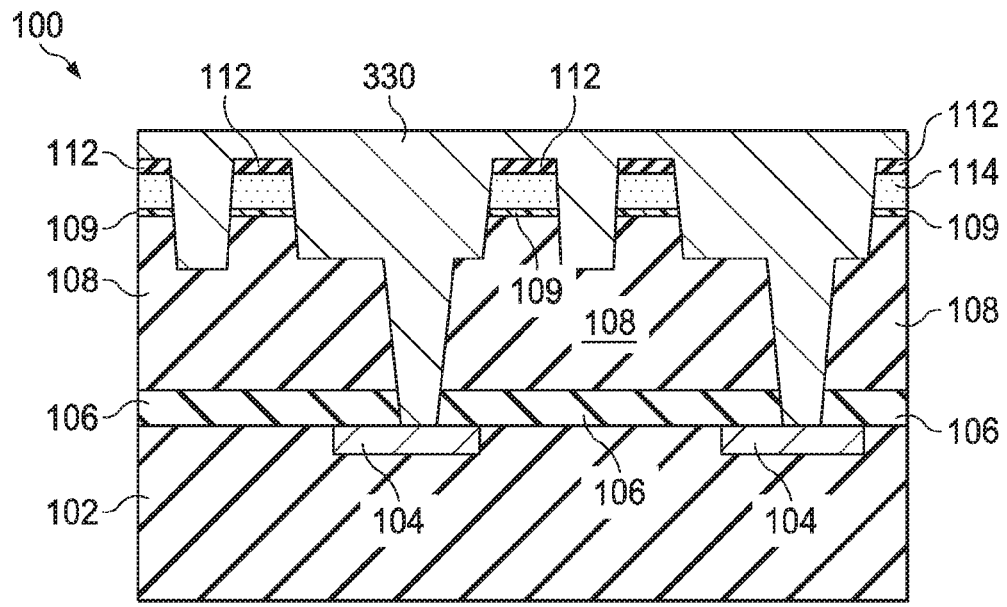

FIG. 3 illustrates the filling of the trench openings 230 and the via openings 232 (see FIG. 2) with a conductive material 330 in accordance with an embodiment. The conductive material 330 may be deposited by CVD, electro-plating, electroless-plating, ALD, PVD, and may be formed of copper, although other suitable materials such as aluminum, tungsten, tungsten nitride, rhuthenium, silver, gold, rhodium, molybdenum, nickel, cobalt, cadmium, zinc, alloys of these, combinations thereof, and the like, may alternatively be utilized. The conductive material 330 may be deposited into the trench openings 230 and the via openings 232 and the deposition may be continued until the conductive material 330 fills the trench openings 230 and the via openings 232 and extends above the hardmask layer 112 (if present).

Optionally, one or more barrier/adhesion layers (not shown) may be formed along the sidewalls of the trench openings 230 and the via openings 232 prior to forming the conductive material 330. In embodiments, such as those using a copper conductive material, a barrier layer may be desirable to limit diffusion of the copper into the surrounding dielectric materials. In an embodiment, the barrier layer may be formed of one or more layers of titanium nitride, titanium, tantalum, tantalum nitride, tungsten nitride, ruthenium, rhodium, platinum, other noble metals, other refractory metals, their nitrides, combinations of these, or the like. The barrier layer may be formed through chemical vapor deposition, although other techniques such as PVD or ALD could alternatively be used.

Figure 4:
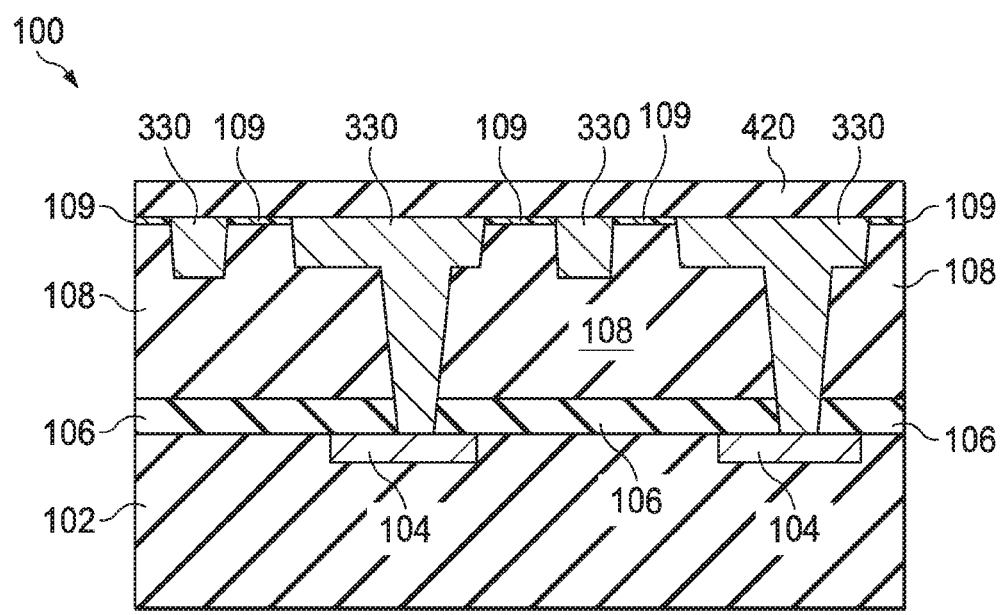

FIG. 4 illustrates removal of excess portions of the conductive material 330 in accordance with an embodiment. In an embodiment, the excess conductive material 330 (and any optional barrier/adhesive layers) formed over the hardmask layer 112 is removed using a planarization process, such as a chemical mechanical polishing process (CMP). Remaining portions of the ARC layer 114 may also be removed during this planarization process.

Thereafter, additional processes may be performed to complete fabrication. For example, FIG. 4 illustrates another dielectric layer 420 formed over the high density monolayer 109. The dielectric layer 420 may be, for example, an etch stop layer for a subsequent etch process, a dielectric layer for an overlying metallization layer, a passivation layer, or the like.

As discussed above, the high density monolayer 109 renders the surface of the second dielectric layer 108 hydrophobic, and the hydrophobic properties reduce or eliminate $Cu^{2+}/Cu^{+}$ residue on the surface of the underlying layer of the second dielectric layer 108. As a result the issues related to TDDB and VBD may be reduced, particularly in smaller technology nodes, such as those at 20 nm and lower.

Figure 5:
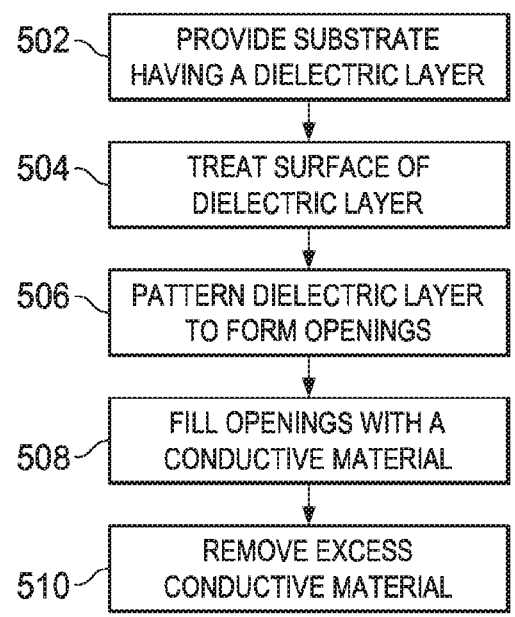
FIG. 5 is a flowchart illustrating a method of forming a semiconductor device in accordance with an embodiment.

FIG. 5 illustrates steps of a method for forming an interconnect in accordance with an embodiment. The method begins in step 502, wherein a substrate is provided having a dielectric layer to be patterned formed thereon. For example, the layer to be patterned may be a dielectric layer such as that used for the metallization layers of a semiconductor device. In step 504, a surface of the dielectric layer is treated to cause the dielectric layer to be hydrophobic, or less hydrophilic. The treatment may comprise forming a high density monolayer such as that described above with reference to FIG. 1.

Next, in step 506, the dielectric layer is patterned by, for example, using photolithography techniques, thereby creating openings in the dielectric layer, as discussed above with reference to FIG. 2. The patterning may include forming an ARC layer and a hardmask layer as described above with reference to FIG. 1. Once patterned, openings are filled with a conductive material, as indicated in step 508 and as discussed above with reference to FIG. 3.

In step 510, excess conductive material may be removed as described above with reference to FIG. 4.

In an embodiment, a method of forming an integrated circuit structure is provided. The method includes providing a substrate having a dielectric layer. A surface of the dielectric layer is treated to form a higher density layer. The dielectric layer is patterned to form openings, which are filled with a conductive material.

In another embodiment, another method of forming an integrated circuit structure is provided. The method includes providing a substrate having a dielectric layer and forming a high density monolayer over the dielectric layer. The dielectric layer and the high density monolayer are patterned to form one or more openings, which are filled with a conductive material. Excess conductive material is removed from the surface of the high density monolayer.

In yet another embodiment, an integrated circuit structure is provided. The structure includes a substrate having a dielectric layer formed thereon and a high density monolayer over the dielectric layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a substrate having a dielectric layer formed thereon, the dielectric layer comprising a single dielectric material;
    a high density monolayer over the dielectric layer; and
    an opening extending through the high density monolayer and into the dielectric layer.

2. The integrated circuit structure of claim 1, wherein the high density monolayer comprises $Si(CH_3)_3$ terminating the dielectric layer.

3. The integrated circuit structure of claim 1, wherein the dielectric layer is formed of a low-k material.

4. The integrated circuit structure of claim 1, wherein the dielectric layer is formed of an ultra low-k material.

5. The integrated circuit structure of claim 1, further comprising a conductive line extending through the high density monolayer and into the dielectric layer.

6. The integrated circuit structure of claim 5, wherein upper surfaces of the conductive line and the high density monolayer are level.

7. The integrated circuit structure of claim 6, further comprising another dielectric layer extending from the high density monolayer on a first side of the conductive line to a second side of the conductive line.

8. An integrated circuit structure comprising:
    a substrate;
    a first dielectric layer over the substrate;
    a conductive element in the first dielectric layer;
    a second dielectric layer over the first dielectric layer;
    a high density monolayer over the second dielectric layer, the high density monolayer having a higher density than the second dielectric layer; and
    a conductive interconnect extending through the second dielectric layer and the high density monolayer to the conductive element.

9. The integrated circuit structure of claim 8, further comprising an etch stop layer underlying the first dielectric layer, the conductive interconnect extending through the etch stop layer.

10. The integrated circuit structure of claim 8, wherein an upper surface of the conductive interconnect is coplanar with an upper surface of the high density monolayer.

11. The integrated circuit structure of claim 8, wherein the high density monolayer comprises $Si(CH_3)_3$.

12. The integrated circuit structure of claim 8, wherein the second dielectric layer comprises a high-k dielectric layer.

13. The integrated circuit structure of claim 1, wherein the dielectric layer is formed of an ultra low-k material.

14. An integrated circuit structure comprising:
    a substrate having a dielectric layer formed thereon;
    a treated surface over the dielectric layer, the treated surface having fewer terminating OH groups than an untreated surface of the dielectric layer; and
    a conductive interconnect extending through the dielectric layer and the treated surface to an underlying conductive element.

15. The integrated circuit structure of claim 14, wherein the treated surface comprises $Si(CH_3)_3$.

16. The integrated circuit structure of claim 15, wherein the treated surface is a monolayer.

17. The integrated circuit structure of claim 14, wherein the treated surface is a monolayer.

18. The integrated circuit structure of claim 14, wherein a surface of the treated surface is level with a surface of the conductive interconnect.

19. The integrated circuit structure of claim 14, wherein the treated surface has a higher density than the dielectric layer.

20. The integrated circuit structure of claim 14, wherein the dielectric layer comprises silicon oxide.

* * * * *